United States Patent [19]

Zagar et al.

[11] Patent Number: 5,587,671
[45] Date of Patent: Dec. 24, 1996

[54] SEMICONDUCTOR DEVICE HAVING AN OUTPUT BUFFER WHICH REDUCES SIGNAL DEGRADATION DUE TO LEAKAGE OF CURRENT

[75] Inventors: Paul Zagar; Troy Manning, both of Boise, Id.

[73] Assignee: Micron Technology, Inc., Boise, Id.

[21] Appl. No.: 238,972

[22] Filed: May 5, 1994

[51] Int. Cl.$^6$ .............................................. H03K 19/0944
[52] U.S. Cl. ................................ 326/83; 326/21; 326/88; 365/189.05
[58] Field of Search ................................ 326/21, 30, 31, 326/83, 80, 88; 327/536; 365/189.05

[56] References Cited

U.S. PATENT DOCUMENTS

| | | | |
|---|---|---|---|
| 4,350,906 | 9/1982 | Gillberg | 326/83 |
| 4,692,638 | 9/1987 | Stiegler | 326/83 |
| 4,736,121 | 4/1988 | Cini et al. | 327/536 |
| 4,806,794 | 2/1989 | Walters, Jr. | 326/30 |
| 5,250,854 | 10/1993 | Lien | 326/21 |
| 5,343,096 | 8/1994 | Heikes et al. | 326/93 |

*Primary Examiner*—Edward P. Westin
*Assistant Examiner*—Benjamin D. Driscoll
*Attorney, Agent, or Firm*—Merchant, Gould, Smith, Edell, Welter & Schmidt, P.A.

[57] ABSTRACT

To compensate for leakage current resulting from parasitic resistance, an integrated circuit device includes a boosting current pump to continuously boost the input of an NMOS output circuit so long as the output circuit is providing a logic high output signal. The NMOS output circuit has an input for receiving an input signal and an output for driving at least one output signal line. An oscillation circuit provides an oscillating digital signal to the boosting current pump. The pump responds to the oscillating digital signal and to the input signal being in one of two predetermined states to provide additional current at the input of the NMOS output circuit to compensate for the leakage current.

24 Claims, 5 Drawing Sheets

5,587,671

SEMICONDUCTOR DEVICE HAVING AN OUTPUT BUFFER WHICH REDUCES SIGNAL DEGRADATION DUE TO LEAKAGE OF CURRENT

FIELD OF THE INVENTION

The present invention relates generally to semiconductor logic devices, such as memory chips, data registers and the like. More particularly, the present invention relates to such devices having data output circuits which are susceptible to failure due to current leakage through parasitic resistance. NMOS transistors, for example, exhibit this tendency. The term "NMOS" refers to semiconductor circuits made using N-channel silicon gate MOS (Metal-Oxide Semiconductor) processing.

BACKGROUND OF THE INVENTION

In the semiconductor industry, semiconductor logic devices are most commonly manufactured using MOS processing. These devices, which include a wide variety of types and applications, employ logic circuitry to manipulate or store input data and NMOS transistors to provide the manipulated or stored data at an output terminal of the device. The NMOS transistors are typically configured in the form of an output buffer (or driver) with the output terminal providing the data in the form of a logic "1" or a logic "0."

Typically, the logic "1" and logic "0" data output signals correspond respectively to 5-volt and 0-volt signal levels controlled by the output buffer. For example, to provide a logic "0" at the output terminal, the output buffer converts the signal at the output terminal from a logic "0" (or an undefined floating level) to the 0-volt level. Ideally, once the correct logic level is provided at the output terminal, there is no change until the output buffer is commanded to change the logic level.

In a circuit having NMOS output-driver transistors, converting to a logic "0" can be accomplished quickly without using any special biasing circuitry at the inputs of the NMOS transistors. Quickly converting to a logic "1," however, is more difficult and often requires "precharging circuitry" to permit the output buffer to convert its output signal to the logic "1" level within a desired period of time. Precharging circuitry typically couples the input of the output driver, via NMOS transistors, to a positive supply voltage, as soon as it can be determined that the output buffer will be providing a logic "1" signal level.

In certain applications, NMOS output buffers have also been implemented using bootstrapping circuitry which enhances the precharging circuitry by coupling the input of the output driver to a signal level that is greater than the positive supply voltage. This increases the performance of the output buffers and permits the output drivers to provide the logic "1" level for an extended time period before leakage at the input of the output driver erases the logic "1" level.

In connection with the present invention, it has been discovered that the extended time period provided by bootstrapping circuitry, arranged as described above, is unduly limited. An NMOS output buffer, even though it is bootstrapped, will fail to provide the specified logic "1" output level after a substantial period of time. Consequently, this can result in failure of the logic device.

One possible approach for overcoming this problem would be to further increase the level of the signal coupled to the inputs of the output drivers, so that the time period required to cause a device failure would be further extended. This approach would be lacking, however, in that, for many applications, it still imposes an unacceptably limited time period before device-failure results.

Accordingly, there is a need for a device having a data output circuit which overcomes the above deficiencies of the prior art.

SUMMARY OF THE INVENTION

Generally, the present invention provides an improved arrangement and method for overcoming the adverse effects of leakage current resulting from inherent parasitic resistance at the input of an output circuit.

In one embodiment, the present invention provides an arrangement and method for overcoming the adverse effects of such leakage current by pumping current to the input of an NMOS output circuit at a rate that approaches or exceeds the rate at which the current is leaking through the parasitic resistance. In this way, the NMOS output circuit can provide the output signal without risk that, over a period of time, the leakage current will cause the output circuit to fail.

In another embodiment of the present invention, a semiconductor circuit device includes: a pre-output section generating a control signal; an NMOS output circuit having an input node coupled to the control signal and having an output node providing an output signal corresponding to the control signal, the input node of the NMOS output circuit coupled to common through parasitic resistance; an oscillation circuit for providing an oscillating digital signal; and a booster circuit, responsive to the oscillating digital signal and to the control signal being in one of two predetermined states, accumulating energy from the oscillating digital signal and providing a boost signal therefrom for the input node of the NMOS output circuit to compensate for leakage current resulting from the parasitic resistance.

The above summary of the present invention is not intended to present each embodiment or every aspect of the present invention. This is the purpose of the figures and the associated description which follow.

BRIEF DESCRIPTION OF THE DRAWINGS

Other aspects and advantages of the present invention may become apparent upon reading the following detailed and upon reference to the drawings in which.

Figure 1:
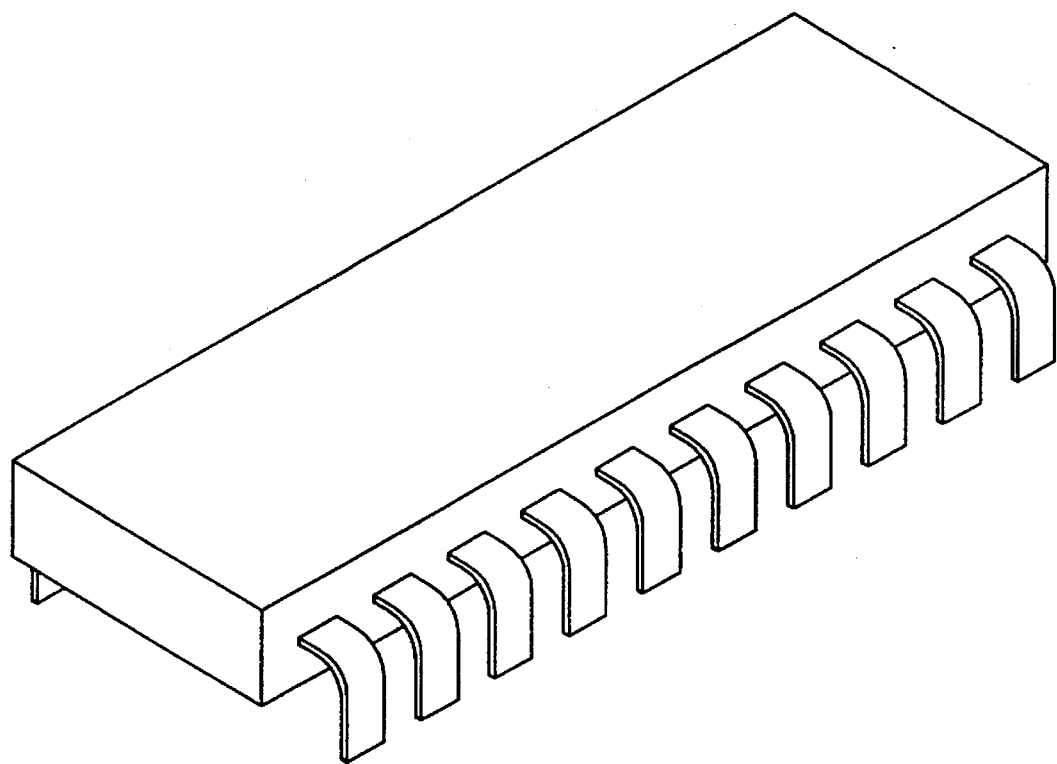
FIG. 1 is a perspective illustration of a semiconductor chip exemplifying a type of circuit device which may incorporate the principles of the present invention.

While the invention is susceptible to various modifications and alterative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE DRAWINGS

The present invention has a wide variety of applications in semiconductor circuits requiring a digital signal to be presented and maintained for a period of time at an output terminal by an NMOS output buffer. For instance, the present invention has application in connection with NMOS output buffers used in memory chips, data registers, counters and flip-flops, each of which may be arranged in a conventional dual-in-line package, depicted as 10 in FIG. 1.

Figure 2:
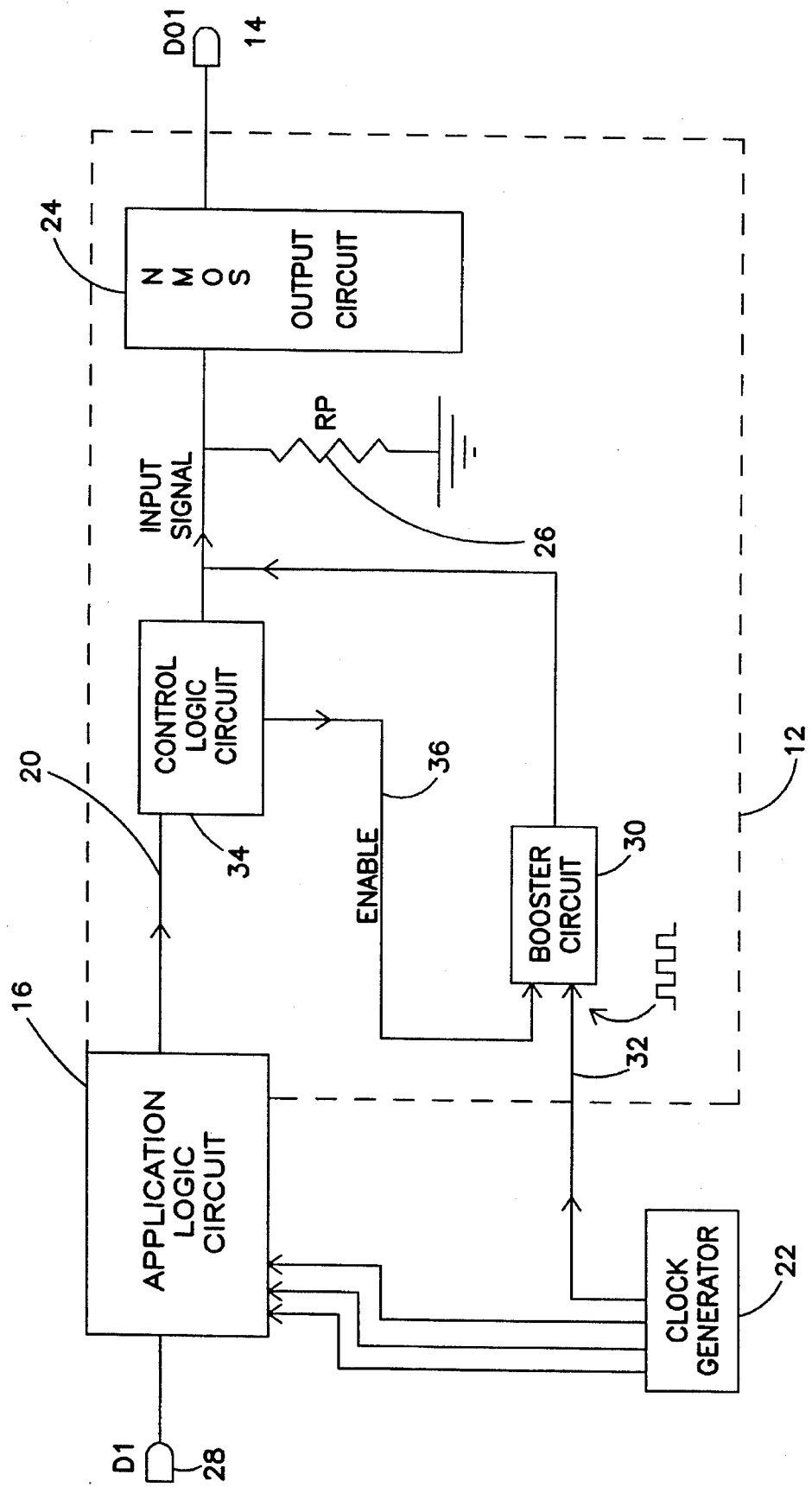
FIG. 2 is a block diagram of an exemplary arrangement and use of an NMOS output buffer implemented in accordance with the present invention.

FIG. 2 illustrates, in block diagram form, an exemplary arrangement and use of an NMOS output buffer 12 implemented in accordance with the present invention. The NMOS output buffer 12 provides a digital data signal at an output terminal 14 indicative of a signal provided by an application logic circuit 16. The application logic circuit 16 represents the principle functioning portion of the circuitry depicted in FIG. 2. As mentioned above, depending on the particular chip in use, the application logic circuit 16 may be the functioning and primary circuitry of a memory chip, a data register, a counter, a flip flop, etc.

Typically, the application logic circuit 16 receives input data at an input terminal 18. After manipulating and/or storing the input data, the application logic circuit produces a control signal at line 20 which is used by an NMOS output buffer 12 to produce a corresponding digital signal at the output terminal 14. A clock generator 22 is commonly (but not always) used in connection with the application logic circuit 16. The clock generator 22 may be internal or external to the chip depicted in FIG. 2 in block diagram form.

Within the NMOS output buffer 12, an NMOS output circuit 24 responds to the control signal provided at line 20 to generate the digital signal at terminal 14. The NMOS output circuit 24 includes an input for receiving an input signal which corresponds to the logic level of the control signal provided at line 20. Associated with the input of the NMOS output circuit 24 is inherent parasitic resistance (Rp) 26 providing a path to ground (or common). This parasitic resistance, which is commonly present but not shown in many engineering circuit schematics, illustrates an inherent current leakage path from the input of NMOS output circuit 24 to ground. Thus, in the event that the input signal is supposed to be 5 volts, over a period of time the current associated with this 5-volt level for driving the NMOS output circuit 24 will leak through the parasitic resistance 26. Should the requisite current for driving the NMOS output circuit 24 leak through the parasitic resistance 26 before the corresponding output data provided at the terminal 14 is accessed by external circuitry, the circuitry chip represented by FIG. 2 will have failed due to the erroneous data being generated.

In accordance with the principles of the present invention, this problem is overcome using a booster circuit 30 to pump current to the input of the NMOS output circuit 24, preferably as long as the input signal corresponds to the high (or 5-volt) level. The booster circuit 30 is preferably arranged to convert an oscillating signal provided at line 32 to a current signal. To maintain the 5-volt level at the input of the output circuit 24, the booster circuit 30 responds to an enable signal provided by a control logic circuit 34 at line 36. The enable signal, which is active (or high) whenever the input signal corresponds to the 5-volt level, controls the current pumping function of the booster circuit 30. Thus, if the enable signal is not active, the booster circuit 30 does not pump current to the input of the NMOS output circuit 24.

Figure 3:
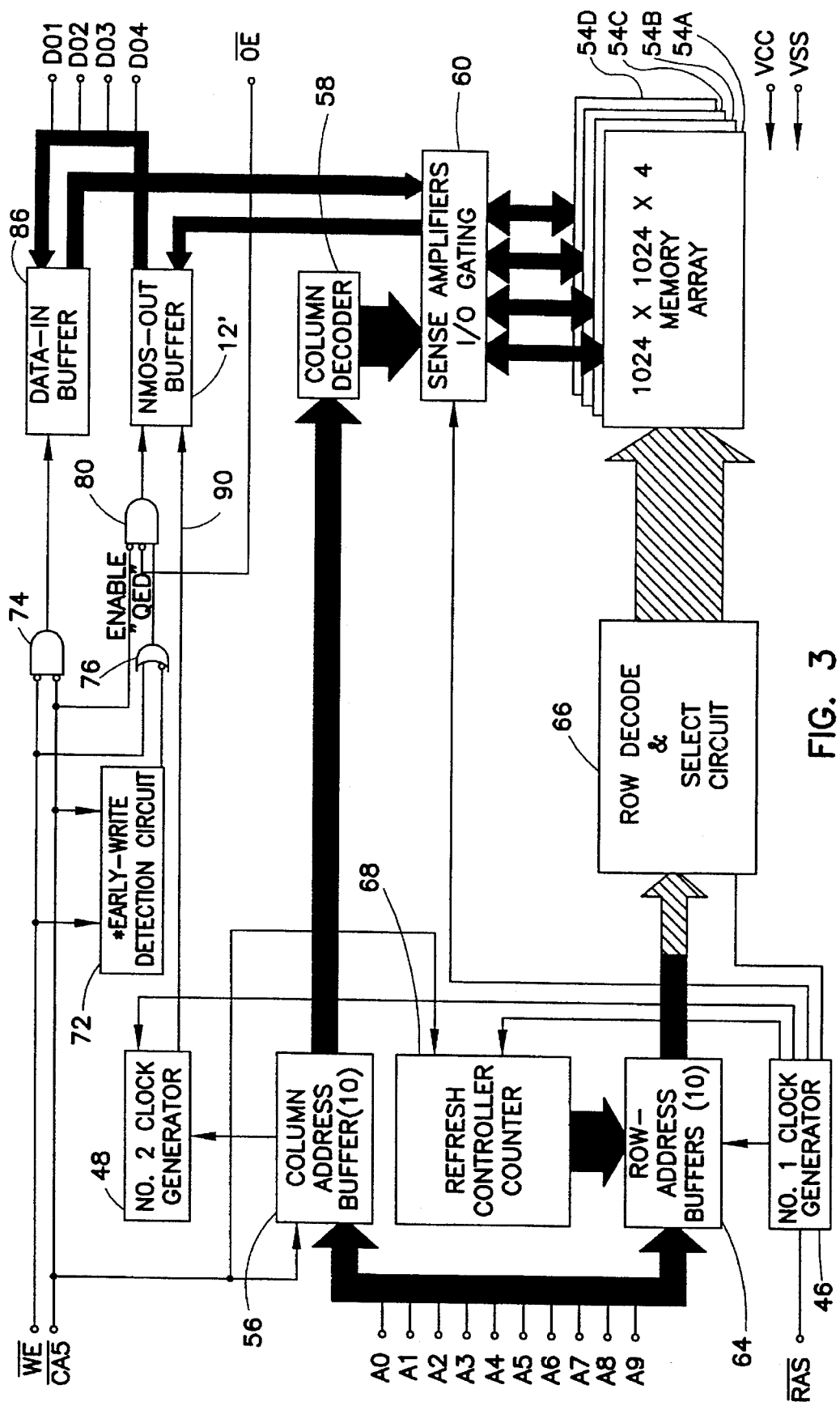
FIG. 3 is a block diagram of a DRAM using an NMOS output buffer implemented in accordance with the present invention.

Before addressing further details of the circuitry depicted in FIG. 2, reference is made to FIG. 3 to illustrate a more specific and highly-advantageous use of the NMOS output buffer 12. In this block diagram, the NMOS output buffer 12 of FIG. 2 is illustrated as output buffer 12', the clock generator 22 of FIG. 2 is depicted as two separate clock generators 46 and 48, and the application logic circuit 16 of FIG. 2 is exploded in further detail as the remaining circuitry shown in FIG. 3. The application logic circuit shown in FIG. 3 represents a 1 megabyte×4 DRAM (dynamic random access memory) having ten address terminals (A0–A9), four output/input data terminals (D01–D04), a write enable terminal (WE*), a column address strobe (CAS*) terminal, a row address strobe (RAS*) terminal, and an output enable (OE*) terminal.

The ten address signals are used in conjunction with the write enable and column and row address strobes to access selected memory cells in each of four memory arrays 54a, 54b, 54c and 54d.

Columns of the memory arrays 54a–54b are accessed conventionally using a column address buffer 56 and a column decoder 58, which select columns of the memory arrays through sense amplifier and I/O gating circuitry 60 and in response to the address signals (A0–A9). Rows of the memory arrays are selected conventionally using row address buffers 64 and row decode and select circuitry 66. A refresh controller and counter 68 is used to refresh the data in the memory cells of the memory arrays by accessing the memory cells on a row-by-row basis via the row address buffer 64 and the row decode and select circuit 66.

The write enable and column address strobe are used as control inputs to an early-write-detection circuit 72, a NOR gate 74, and logic gates 76 and 80. The output of the gate 74 provides an enable signal to a data input buffer 86, which permits data at the data terminals D01–D04 to be written into the memory array via the sense amplifier and I/O gating circuit 60. The gate 76 provides a signal referred to as "QED" to indicate that the DRAM is not in the write-to-memory mode. One input of the gate 76 is connected to the write enable terminal and the other input of the gate 76 is connected to the output of the early-write-detection circuit 72. Thus, if the output of the gate 76 is at a logic "0", then the gate 80 will disable the NMOS output buffer 12'. This can be important because the NMOS output buffer 12' can interfere with the input signals being presented at the data terminals (D01–D04).

The early-write-detection circuit 72 can be implemented using one or more latches to detect write enable (WE*) before the column address strobe transitions from a high level to a low level.

The output buffer 12' is enabled only in the event that the column address strobe is low for permitting access to the memory array. The output enable signal goes low to permit data from the output buffer 12' to be written to the data terminals when the output of the gate 76 is high.

The NMOS output buffer 12' also receives a clock signal on line 90. Preferably, the No. 2 clock generator 48 provides this clock signal on a continuous basis at a relatively slow frequency, for example, at about one megahertz and at a fifty-percent duty cycle.

Figure 4:
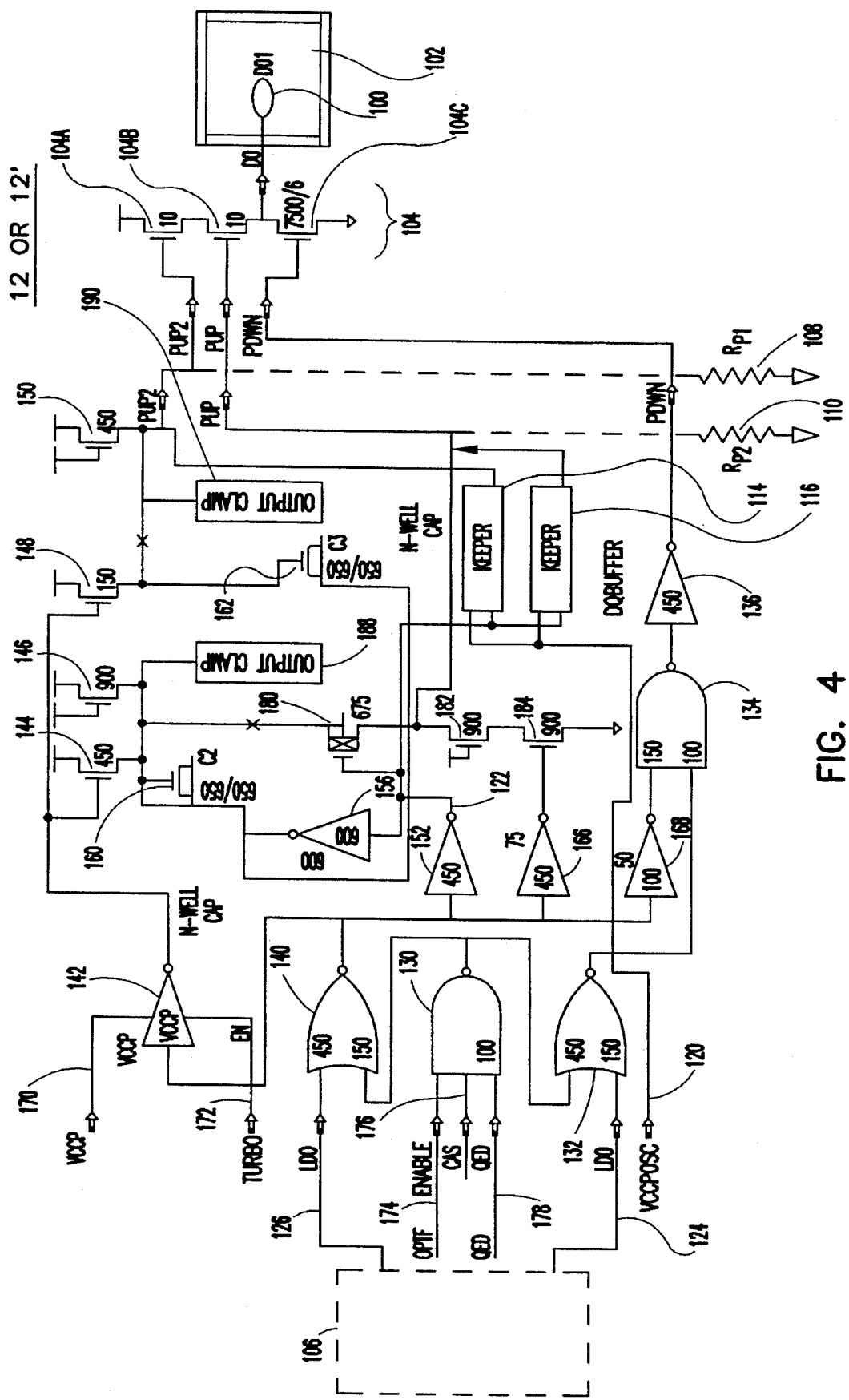
FIG. 4 is detailed schematic of an NMOS output buffer, which is implemented in accordance with the principles of the present invention.

Referring now to FIG. 4, the NMOS output buffer 12 of FIG. 2 is illustrated in exploded form. To use the output buffer of FIG. 4 in the DRAM application shown in FIG. 3, the output buffer of FIG. 4 is replicated four times for each of the required dam output terminals. The data provided at the data terminal 100 of FIG. 4 is driven by an output circuit 104 consisting of three NMOS transistors 104A, 104B and 104C. The respective gates of the transistors 104A and 104B receive active high ("1") signals in response to a control signal provided by a latch 106. If the latch 106 provides the control signal such that the signal on line 126 is at a logic low level, the gates of the transistors 104A and 104B receive active high signals to force the signal at the terminal 100 to a logic high level. Similarly, when the gate of the transistor 104C receives an active high signal in response to the signal on line 124 being at a logic low level, the gate of the transistor 104C receives an active high signal to force the signal at the terminal 100 to a logic low level.

To maintain that the logic high level at the gates of the transistors 104A and 104B in light of leakage current through the inherent parasitic resistance 108 and 110, the booster circuit 30 of FIG. 2 is shown in FIG. 4 as including keeper circuits 114 and 116, each of which responds both to an oscillating (or clock) signal provided on line 120 and to enable signal provided on line 122. Without the keeper circuits 114 and 116, current leakage through the parasitic resistance 108 or 110 can be so significant that the corresponding transistor 104A or 104B reverts to the OFF state, and the logic high level at the data terminal 100 changes to an erroneous logic low state.

The enable signal at line 122 is provided by logic circuitry which interprets the control signal provided by the latch 106. The latch 106 can be implemented, for example, using a cross-coupled NAND-gate arrangement having differential outputs provided at lines 124 and 126 functioning as previously described. Such a latch is conventional and used in commercially available integrated circuits, such as MT4C4001J (1 meg×4 DRAM), manufactured and sold by Micron Technology, Inc.

In response to the latch 106 producing a logic low level at line 124, and assuming that the output of NAND gate 130 is low, NOR gate 132 essentially inverts the logic low level at line 124 for presentation to a NAND gate 134. The NAND gate 134 receives the output signal from NOR gate 132 and the output of the NOR gate 140, via an inverter 168. If the signal at line 126 is low, indicating that the data at terminal 100 should be high, then the NAND gate 134 is disabled to prevent the transistor 104C from being activated. Similarly, if any input to the NAND gate 130 is low, indicating that any output signal by the output buffer of FIG. 4 is inappropriate, then the NAND gate 134 is also disabled. An inverter 136 is located between the output of the NAND gate 134 and gate of the transistor 104C to bias the gate of the transistor 104C at a logic high level only under the above-stated conditions.

When the latch 106 provides a logic low at line 126, indicating that the digital output signal at the terminal 100 should be high, a number of circuits are engaged. Once again, assuming that the output of the NAND gate 130 is low, the NOR gate 140 essentially inverts the low level signal at lines 126 for presentation to: pull-up circuitry comprising an inverter 142 and NMOS transistors 144, 146, 148 and 150; an inverter 152 which generates the enable signal on line 122 for enabling the keeper circuits 114 and 116 and also, via an invertor 156, for enabling a boot strap circuit which includes voltage-doubling capacitors 160 and 162 for proper biasing of the gates of transistors 104B and 104A, respectively; and an inverter 166 which quickly activates a switched current path from the capacitor 160 to the gate of the transistor 104B.

The input signals, which are illustrated along the left side of FIG. 4, for controlling the NMOS output circuit 104 are now described. There are six such signals. These signals are referred to as VCCP, TURBO, ENABLE, CAS, QED, and the previously described clock signal "VCCPOSC" carried by line 120.

VCCP, which is carried by line 170, provides power to the inverter 142. VCCP can be provided by the same power supply circuit which provides VCC. The voltage level of VCCP is preferably set slightly greater than the voltage level for VCC, for example, 6.5 volts for VCCP versus 5 volts for VCC. The inverter 142 is further illustrated and described in connection with FIG. 6.

TURBO, which is carried by line 172, acts as an enable signal for the inverter 142 to permit the pull-up circuitry to perform its precharging function of immediately biasing the gates of transistors 104A and 104B as soon as the output of the gate 140 transits from a low level to a high level.

ENABLE, which is carried by line 174, is preferably a chip-selectable signal used for enabling/disabling the NAND gate 130 to permit, for instance, the DRAM to be configured with one or more of output buffers being disabled. Preferably, both the TURBO and ENABLE signals are laser-fused or bonded, so that they are permanently fixed at the desired logic level before power is provided to the circuit. Alternatively, the logic level(s) for one or both of these signals can be selected using an externally-provided signal.

CAS, which is carried by line 176, is the column address strobe described previously in connection with FIG. 3. CAS is received by the NAND gate 130, so that the output buffer of FIG. 4 does not provide any bias at the bi-directional data terminal 100 when the memory array is being accessed.

QED, which is carried by line 178, functions as a quick enable/disable control for the NMOS output buffer of FIG. 4 in response to the write-enable signal (WE*) and the column address strobe (CAS*) indicating that memory array is about to be written to. This QED signal can be generated using the previously-described early-write-detection circuit (72 of FIG. 3).

Turning now to the bootstrap circuitry (activated by the inverter 156), when the voltage level at the output of the inverter 156 transits from a logic low to a logic high, the voltages on the pulled-up side of the capacitors 160 and 162 are effectively doubled by virtue of the instantaneous change across the capacitors. By the time the signal at the output of the invertor 156 transits to a high level, the enable signal at line 122 will have caused a P-channel transistor 180 to couple the pulled-up side of capacitor 160 to the gate of the transistor 104B. The transistor 180 is connected directly to the gate of the transistor 104B and is also connected to a transistor 182. The transistor 182 provides a path to ground through a transistor 184 in response to the output of the inverter 166 going low. Thus, the timing and associated delays of the various logic gates depicted in FIG. 4 are important in that the current path, from the pulled-up side of the capacitor 160 to ground (via the transistor 184), should be established before the voltage at the output of the inverter 156 is coupled across the capacitor 160. This permits the desired high voltage bias at the gate of the transistor 104B without undue delay.

The pulled-up side of the capacitor 162, unlike the capacitor 160, is connected directly to the gate of the transistor 104A. Unlike the biasing required at the gate of 104B, the biasing at gate 104A is set at the maximum boot strap level.

The NMOS output circuit 104, which, by definition includes at least one or more transistors susceptible to inadvertent deactivation due to leakage current through parasitic resistance, provides a three-state output at the data terminal 100: a logic high level which is present when the signal at line 126 goes low; a logic low level which is present when the signal at line 124 is low; and a high impedance signal, having neither a high bias nor a low bias, when neither the signal at line 124 nor the signal at line 126 is low or when the NAND gate 130 produces a high logic high level at its output.

A clamping circuit, comprising output clamp blocks 188 and 190, provides a ceiling for the voltage level at the pulled-up side at the respective capacitors 160 and 162.

Figure 7:
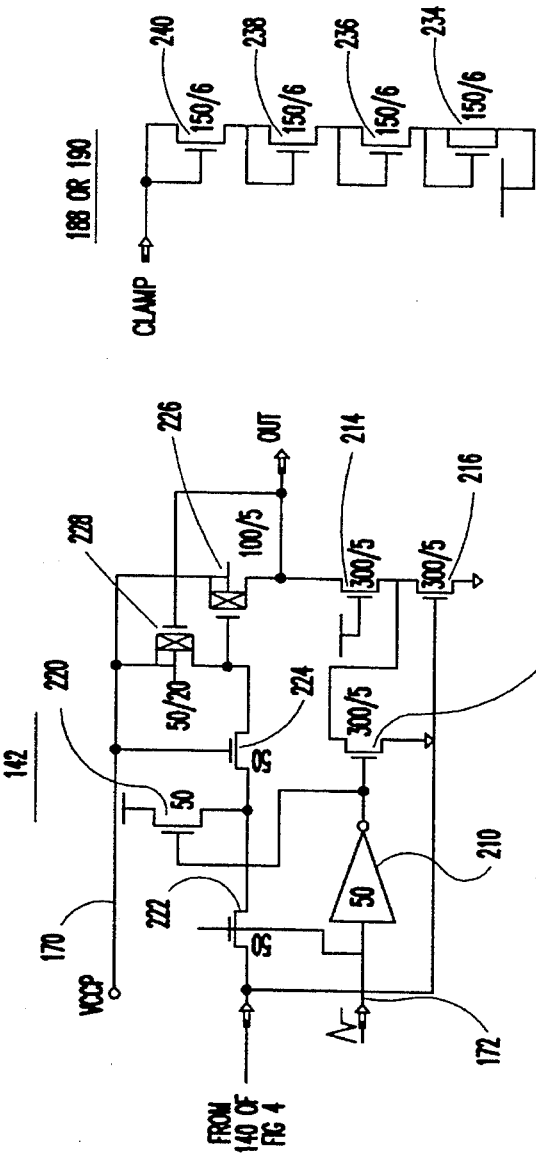
FIG. 7 is an exploded schematic view of a clamping circuit shown in block diagram form in FIG. 4.
Figure 6:
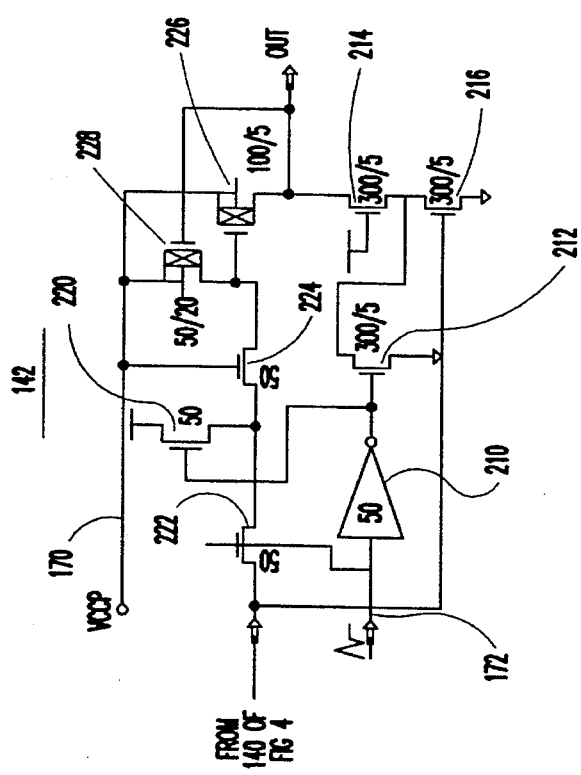
FIG. 6 is an exploded schematic view of a VCCP inverter circuit shown in logic symbol form in FIG. 4.
Figure 5:
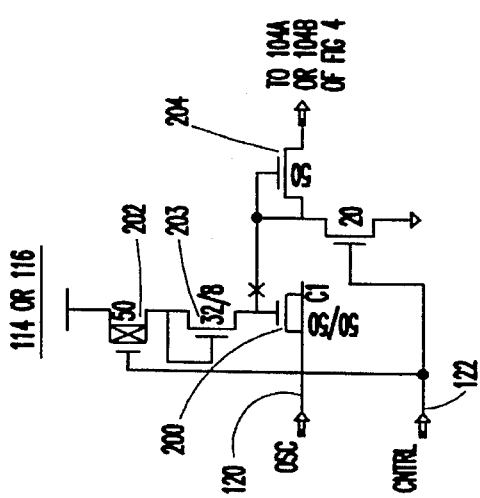
FIG. 5 is an exploded schematic view of a booster circuit shown in block diagram form in FIG. 4.

FIGS. 5, 6 and 7 respectively illustrate exploded views of the keeper circuit 114 or 116, the inverter 142, and the output clamp block 188 or 190. The oscillating digital signal presented at line 120 provides a doubled pull-up voltage on the other side of a capacitor 200 whenever the enable signal is present on line 122. With the enable signal present, a P-channel transistor 202 is engaged, thereby permitting the upper terminal of the capacitor 200 to be biased (or pulled) up toward the VCC voltage level. Thus, when the oscillating digital signal transitions from a low to high level, the capacitor 200 acts as a voltage doubler accumulating a significant charge from which current is pumped, via a switching transistor 204 to the gate of transistor 104A or 104B. The transistor 204 is activated whenever the charge at the pulled-up side of the capacitor 200 exceeds the voltage level at the gate of the transistor 104A or 104B by the specified voltage threshold of the transistor 204. The transistor 203 is arranged as a diode between the transistor 202 and the pulled-up side of the capacitor 200 to protect the transistor 202. Preferably, the size of the transistor 204 and the size of the transistor-arranged capacitor 200 are selected based on the worst case parasitic resistance at the gate of the transistor 104A or 104B, so that the rate of current pumped from the charge on the capacitor 200 meets or exceeds the rate of current leaking through the parasitic resistance. In this manner, the NMOS output circuit 104 of FIG. 4 maintains a high level at the output terminal 100 indefinitely without risk of insufficient power at the gates of the transistors 104A and 104B. Alternatively, the rate of current pumped from the capacitor 200 can be less than the rate of current leaking through the parasitic resistance. This implementation, although incapable of providing a logic high level at the date terminal 100 indefinitely, significantly extends the longevity of the high level signal before the leakage current through the parasitic resistance can cause the output circuit 104 to fail.

In FIG. 6, the inverter 142 includes an inverter 210 which responds to TURBO carried by line 172 going low, by activating a transistor 212, which effectively connects transistors 214 and 216 to ground, and thereby connects the output of the inverter 142 to ground, so as to disable the pull-up circuitry discussed in connection with transistors 144, 146, 148 and 150 of FIG. 4. When TURBO is high, a current path is provided from NOR gate 140 of FIG. 4 through transistors 222 and 224 to the gate of a transistor 226. When the output of the NOR gate 140 is low, the transistor 226 is activated, so as to couple the VCCP voltage level to the output of the inverter 142. When the output of the NOR gate 140 is high, its direct connection to the gate of the transistor 216 activates the transistor 216 to force the output of the inverter 142 low. So long as the output of the inverter 142 is low, a transistor 228, arranged in feedback between the output and the gate of the transistor 226, maintains the gate of the transistor 226 at the VCCP level to prevent the transistor 226 from activating.

Referring now to FIG. 7, the output clamp block 188 or 190 is illustrated as using a series of four diode-arranged transistors 234, 236, 238 and 240. The first of these transistors 234 is shown having an optional short circuit across the source-drain junction so as to modify the voltage threshold "or ceiling" provided by the clamping circuit.

The principles of the present invention, which have been disclosed by way of the above examples and discussion, can be implemented using various circuit types and arrangements. The NMOS output buffer, for instance, can be implemented using a non-tristate transistor arrangement with, or without, other transistors manufactured using processing (such as CMOS and PMOS) other than NMOS. A more complex NMOS output circuit can be used and implemented with semiconductor processing other than exclusively NMOS. Further, the latching circuit, which provides the control signal to the NMOS output buffer in differential form, can be implemented in a variety of ways including, for example, non-latching circuitry. The various signals used to enable and disable the operation of certain signals, of course, can be connected at different points along the signal paths. Those skilled in the art will readily recognize that these and various other modifications and changes may be made to the present invention without strictly following the exemplary application illustrated and described herein and without departing from the true spirit and scope of the present invention, which is set forth in the following claims.

We claim:

1. A semiconductor circuit device operating from at least one supply voltage and common, comprising:

a pre-output circuit generating a control signal;

a logic circuit generating an enable signal in response to the control signal;

an NMOS output circuit having an input node coupled to the control signal and having an output node providing an output signal corresponding to the control signal, the input node of the NMOS output circuit coupled to common through parasitic resistance;

an oscillation circuit for providing an oscillating digital signal; and a booster circuit, responsive to the oscillating digital signal and to the control signal being in one of two predetermined states, accumulating energy from the oscillating digital signal and providing a boost signal therefrom, also in response to the enable signal, for the input node of the NMOS output circuit to compensate for leakage current.

2. A semiconductor circuit device, according to claim 1, wherein the booster circuit includes a voltage-doubling circuit having a capacitive element which receives the oscillating digital signal and includes a transistor switch circuit which discharges the capacitive element in response to the control signal being in the other of the predetermined states.

3. A semiconductor circuit device, according to claim 1, wherein the booster circuit includes a voltage-doubling circuit receiving the oscillating digital signal.

4. A semiconductor circuit device, according to claim 3, wherein the voltage-doubling circuit includes a capacitive element having one terminal arranged to receive the oscillating digital signal and another terminal coupled to a current driver arranged to drive current to the input of the NMOS output circuit using energy stored at the capacitive element.

5. A semiconductor circuit device, according to claim 1, wherein the booster circuit is arranged to drive current to the input of the NMOS output circuit.

6. A semiconductor circuit device, according to claim 1, further including a pull-up circuit coupled to the input of the NMOS output circuit.

7. A semiconductor circuit device, according to claim 6, further including a clamping circuit, coupled to the pull-up circuit and to the input of the NMOS output circuit, for preventing the input of the NMOS output circuit from exceeding a predetermined voltage threshold.

8. For use in a semiconductor circuit device, an NMOS output buffer responsive to a control signal generated in the semiconductor circuit device, the NMOS output buffer comprising:

an NMOS output circuit having an input coupled to the control signal and an output for providing an output signal corresponding to the control signal;

a pull-up circuit, coupled to the input of the NMOS output circuit;

a logic circuit for providing an enable signal to indicate whether the control signal is in one of two predetermined states;

an oscillation circuit for providing an oscillating digital signal; and a booster circuit, arranged to receive the oscillating digital signal and responsive to the enable signal, for providing current to the input of the NMOS output circuit to compensate for leakage current via parasitic resistance, the booster circuit further arranged to provide said current until the enable signal indicates that the control signal is in the other of the two predetermined states.

9. An NMOS output buffer, according to claim 8, further including a voltage doubler circuit, responsive to the enable signal, for providing current to the input of the NMOS output circuit.

10. An NMOS output buffer, according to claim 8, further including a clamping circuit, coupled to the pull-up circuit and to the input of the NMOS output circuit, for preventing any voltage level at the input from exceeding a predetermined voltage threshold.

11. An NMOS output buffer, according to claim 10, further including a supply node, wherein the input of the NMOS output circuit comprises two input ports, and the pull-up circuit comprises a first pull-up circuit coupling one of the input ports to the supply node and a second pull-up circuit coupling the other of the input ports to the supply node.

12. An NMOS output buffer, according to claim 8, further including a supply node, wherein the input of the NMOS output circuit comprises two input ports, and the pull-up circuit comprises a first pull-up circuit coupling one of the input ports to the supply node and a second pull-up circuit coupling the other of the input ports to the supply node.

13. An NMOS output buffer, according to claim 8, further including a supply node, wherein the input of the NMOS output circuit comprises two input ports, and the pull-up circuit comprises a first pull-up circuit coupling one of the input ports to the supply node and a second pull-up circuit coupling the other of the input ports to the supply node; and further including a first voltage doubler circuit, responsive to the enable signal, for providing current to said one of the input ports, and a second voltage doubler circuit, responsive to the enable signal, for providing current to the other of the input ports.

14. An NMOS output buffer, according to claim 13, wherein the booster circuit comprises a first booster circuit, arranged to receive the oscillating digital signal and responsive to the enable signal, for providing a first current signal to said one of the input ports, and a second booster circuit, arranged to receive the oscillating digital signal and responsive to the enable signal, for providing a second current signal to the other of the input ports.

15. An NMOS output buffer, according to claim 14, wherein each of the first and second booster circuits includes a respective voltage doubler circuit.

16. An NMOS output buffer, according to claim 14, wherein the input of the NMOS output circuit further includes a third input port for driving said at least one output signal line at a logic low level in response to the input signal being in the other the two predetermined states.

17. An NMOS output buffer, according to claim 16, further including a clamping circuit, coupled to the pull-up circuit and to the ON input of the NMOS output circuit, for preventing any voltage level at the ON input of the NMOS output circuit from exceeding a predetermined voltage threshold.

18. An NMOS output buffer, according to claim 16, wherein the booster circuit further includes a voltage doubler circuit.

19. For use in a semiconductor circuit device, an NMOS output buffer for receiving a latched input-to-buffer signal for providing therefrom a digital signal at an output terminal, the NMOS output buffer comprising:

an NMOS output circuit having an ON input for receiving an ON input signal, an OFF input for receiving an OFF input signal, and an output providing the digital signal at the output terminal in response to the signals at the ON and OFF inputs;

a pull-up circuit coupled to the ON input of the NMOS output circuit;

a logic circuit for providing an enable signal to indicate whether the latched input-to-buffer signal is in one of two predetermined states and providing the ON and OFF input signals to the NMOS output circuit;

a voltage doubler, including a capacitive circuit, for providing a boosted voltage signal in response to the enable signal;

a current driver, connected to the voltage doubler, for driving current to the ON input of the NMOS output circuit;

an oscillation circuit for providing an oscillating digital signal; and a booster circuit, arranged to receive the oscillating digital signal and responsive to the enable signal, for providing current to the ON input of the NMOS output circuit to compensate for leakage current via parasitic resistance, the booster circuit further arranged to provide said current until the enable signal indicates that the input-to-buffer signal is in the other of the two predetermined states.

20. An NMOS output buffer, according to claim 19, further including a clamping circuit, coupled to the pull-up circuit and to the ON input of the NMOS output circuit, for preventing any voltage level at the ON input of the NMOS output circuit from exceeding a predetermined voltage threshold.

21. An NMOS output buffer, according to claim 19, wherein the booster circuit further includes a voltage doubler circuit.

22. For use in a semiconductor circuit having an output buffer having an input coupled to common through parasitic resistance, a method for decreasing the risk that leakage current through the parasitic resistance may cause the output buffer to provide an erroneous digital output signal, the method comprising:

using an enabling circuit within the output buffer to indicate when the digital output signal should be at one of two predetermined logic states;

providing an oscillating digital signal;

converting the oscillating digital signal to a current boost signal; and in response to indicating that the digital output signal should be at the one predetermined logic state, coupling the current boost signal to the enabling circuit of the output buffer to compensate for the leakage current.

23. The method of claim 22, wherein converting the oscillating digital signal to a current boost signal includes providing the current boost signal at a rate that is at least equal to the rate at which the current is leaking through the parasitic resistance.

24. For use in a semiconductor circuit including an output buffer having an enabling circuit within the output buffer and having an input coupled to common through parasitic resistance, a circuit for decreasing the risk that leakage current through the parasitic resistance may cause the output buffer to provide an erroneous digital output signal, the circuit comprising:

a logic circuit indicating when the digital output signal should be at one of two predetermined logic states;

an oscillator providing an oscillating digital signal;

a circuit for converting the oscillating digital signal to a current boost signal; and a coupling circuit, in response to determining that the digital output signal should be at the one predetermined logic state, for coupling the current boost signal to the enabling circuit of the output buffer to compensate for the leakage current.

\* \* \* \* \*